United States Patent
Eustache et al.

(10) Patent No.: US 11,515,394 B2
(45) Date of Patent: Nov. 29, 2022

(54) METHOD FOR THE NANOSCALE ETCHING OF A GERMANIUM-TIN ALLOY (GESN) FOR A FET TRANSISTOR

(71) Applicants: COMMISSARIAT A L'ENERGIE ATOMIQUE ET AUX ENERGIES ALTERNATIVES, Paris (FR); Centre national de la recherche scientifique, Paris (FR)

(72) Inventors: Etienne Eustache, Chalon sur Saone (FR); Bassem Salem, Sassenage (FR); Jean-Michel Hartmann, Grenoble (FR); Franck Bassani, Echirolles (FR); Mohamed-Aymen Mahjoub, Clermont-Ferrand (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 17/156,326

(22) Filed: Jan. 22, 2021

(65) Prior Publication Data

US 2021/0242313 A1 Aug. 5, 2021

(30) Foreign Application Priority Data

Jan. 31, 2020 (FR) ........................................ 2000967

(51) Int. Cl.
*H01L 29/161* (2006.01)
*H01L 29/06* (2006.01)
*H01L 21/3065* (2006.01)

(52) U.S. Cl.
CPC ........ *H01L 29/161* (2013.01); *H01L 21/3065* (2013.01); *H01L 29/0669* (2013.01)

(58) Field of Classification Search
CPC ............... H01L 21/3065; H01L 29/161; H01L 29/0673; H01L 29/785
See application file for complete search history.

(56) References Cited

U.S. PATENT DOCUMENTS

| 2014/0138744 | A1 | 5/2014 | Kotlyar et al. |
| 2015/0102465 | A1* | 4/2015 | Chen ................ H01L 21/02532 438/492 |
| 2017/0365674 | A1* | 12/2017 | Lee ..................... H01L 27/0886 |

OTHER PUBLICATIONS

Dian Lei et al. Germanium-Tin (GeSn) P-Channel Fin Field-Effect Transistor Fabricated on a Novel GeSn-on-Insulator Substrate, IEEE Transactions on Electron Devices, vol. 65, Iss. 9, pp. 3754-3761 (Year: 2018).*

(Continued)

*Primary Examiner* — Changhyun Yi
(74) *Attorney, Agent, or Firm* — BakerHostetler

(57) ABSTRACT

A method for the nanoscale etching of a layer of $Ge_{1-x}Sn_x$ on a carrier for a FET transistor, x being the concentration of tin in the GeSn alloy, the etching method includes a step of plasma-etching the layer of $Ge_{1-x}Sn_x$ using a mixture comprising dichlorine ($Cl_2$) and dinitrogen ($N_2$) and under an etching pressure lower than or equal to 50 mTorr, preferably lower than or equal to 10 mTorr. A method for producing a conduction channel on a carrier for a FET transistor, comprising a step of forming a layer of $Ge_{1-x}Sn_x$ on the carrier, the layer being produced by epitaxial growth, and a step of etching the layer of $Ge_{1-x}Sn_x$ according to the etching method. A conduction channel made of $Ge_{1-x}Sn_x$ for a FET transistor, the channel being obtained according to the production method, and a FET transistor comprising a plurality of conduction channels made of $Ge_{1-x}Sn_x$.

13 Claims, 6 Drawing Sheets

(56) References Cited

OTHER PUBLICATIONS

Wei Wang et al. "Digital Etch Technique for Forming Ultra-Scaled Germanium-Tin (Ge1—xSnx) Fin Structure", May 12, 2017, Nature, Scientificreports, pp. 1-9 (Year: 2017).*

Shang, et al., "Dry-wet digital etching of Ge1—xSnx", Applied Physics Letters, vol. 108, No. 6, 2016.

Milord, et al., "Inductively coupled plasma etching of germanium tin for the fabrication of photonic components", Proceedings of SPIE, vol. 10108, (2017).

* cited by examiner

METHOD FOR THE NANOSCALE ETCHING OF A GERMANIUM-TIN ALLOY (GESN) FOR A FET TRANSISTOR

CROSS-REFERENCE TO RELATED APPLICATIONS

This application claims priority to foreign French patent application No. FR 2000967, filed on Jan. 31, 2020, the disclosure of which is incorporated by reference in its entirety.

FIELD OF THE INVENTION

The present invention relates to the field of producing FET (field-effect transistor) transistors comprising conduction channels. More specifically, the invention relates to a method for etching a germanium-tin alloy, in particular to produce conduction channels for a FET transistor.

The invention applies in particular to the production of FinFET (fin field-effect transistor) transistors, GAAFET (gate-all-around field-effect transistor) transistors, or tunnel FET (TFET) transistors.

In general, the invention applies to the production of transistors that are advantageously intended for high-performance and low-consumption logic applications in microelectronics, and/or may be used for "IoT" (Internet of things) applications.

BACKGROUND

The MOSFET (metal-oxide-semiconductor field-effect transistor) transistor is one of the transistors most commonly used nowadays in microelectronics applications. It makes it possible to control the flow of a current between two regions, called the source and drain regions. It comprises a plurality of basic elements:
 a semiconductor channel which serves as a conduction region, which channel may be called the "conduction channel";
 source and drain regions at the two ends of the channel;
 a metal gate with the intercalation of an insulator (the gate oxide) which allows the conduction of current to be controlled.

Since the production of the first MOSFET transistors, they have decreased greatly in size. However, designers encounter increasingly restrictive physical limitations with respect to the dimensions (the size of of the gate in particular cannot be decreased forever), to the precision of production processes, to the materials and to parasitic physical phenomena. For example, transistors of small size exhibit parasitic effects, due to the effects of short channels and to poor dissipation of the heat given off during the operation of miniaturized MOSFETs.

The technological solutions for circumventing and/or compensating for these parasitic effects are in particular special architectures, referred to as "multigate" or "3D" architectures, which comprise a gate surrounding the channel either partially or entirely. These special architectures make it possible to improve the electrostatic control of the channel, thereby limiting the effects of short channels. This improvement in electrostatic control is proportional to the area of the gate which covers the channel. Additionally, these architectures make it possible to increase the density of transistors since they make it possible to produce stacks of transistors and thus make use of the vertical dimension of a chip, unlike the standard design which mainly occupies the horizontal plane.

FinFET- and GAAFET-type transistors belong to the family of transistors called "multigate" or "3D" which therefore allow the electrostatic control of the conduction channel by the gate to be improved.

A "FinFET" ("fin field-effect transistor") field-effect transistor is a transistor constructed in a substrate where the gate is placed on two, three or four sides of the channel or wrapped around the channel, forming a multigate structure. The generic name comes from the fact that the conduction channel, and in particular the source/drain region, forms "fins" on the surface of the substrate. FinFET transistors have very short switching times and a high current density.

A "GAAFET" ("gate-all-around field-effect transistor") field-effect transistor is a transistor in which the conduction channel is entirely surrounded by the gate, in which electrostatic control is maximized. This configuration has the advantage of providing a good compromise between the electrostatic control of the channel by the gate and the control current that are obtained.

A GAAFET transistor may be formed by superposing one or more nanowires or nanolayers, each forming a a channel surrounded by the gate. The nanowires may be arranged horizontally or vertically.

Despite these special architectures, as the dimensions of transistors continue to decrease, the low mobility of silicon (Si)-based materials becomes a major limiting factor on its performance. To maintain, or even improve, the performance of the transistor while decreasing its dimensions, it has become necessary to use channel materials that have a higher mobility than silicon. It is known practice to use germanium (Ge) or a silicon-germanium alloy (SiGe) as channel materials. Germanium has four times the mobility of Si.

More recently, germanium-tin alloys (GeSn or $Ge_{1-x}Sn_x$) have appeared as promising candidates for the production of high-performance and low-power-consumption MOSFET transistors. In comparison with pure germanium or silicon, $Ge_{1-x}Sn_x$ has a smaller band gap, lower carrier effective masses, higher carrier mobility and a transition from an indirect gap to a direct gap for tin (Sn) concentrations higher than about 8% (i.e. for x higher than 8%). More precisely, by increasing the value x, i.e. the tin concentration, the band-gap energy of $Ge_{1-x}Sn_x$ may be decreased, the carrier effective mass may be lower and the carrier mobility may be higher. This makes it possible in particular to apply low voltages to the gate and obtain low-consumption transistors.

Thus, it is highly advantageous to use multigate structures made of GeSn alloys in order to combine the advantages of such a material with the advantages of these multigate architectures in terms of electrostatic channel control. In particular, it is essential to produce vertical and horizontal nanowires, or fins made of GeSn.

In addition, to further limit power consumption, the tunnel-effect transistor (TFET) may be used. The basic structure of a TFET is similar to that of a MOSFET with the exception that the source and the drain of the TFET are doped with opposite types. A common TFET structure is a P-I-N (p-doped, intrinsic, n-doped) junction. The intrinsic junction electrostatic potential is controlled by the gate. The TFET may allow biasing with lower supply voltages. However, the TFET has a weaker on-state current than a conventional MOSFET. Since this current is directly related to the carrier effective mass and to the band-gap energy of the material used, GeSn alloys are also particularly advantageous for TFETs and especially as the material for the "source" electrode.

Recently, a great deal of progress has been made regarding the epitaxial growth of GeSn alloys, in particular using chemical vapour deposition ("CVD") or molecular-beam epitaxy ("MBE"). GeSn alloys are typically produced on a layer of Ge which is itself deposited on a substrate, typically a silicon substrate.

In addition to the high crystal quality required for GeSn alloys, it is essential to develop methods for etching GeSn, and in particular methods for etching GeSn that make it possible to obtain fins or nanowires based on $Ge_{1-x}Sn_x$ with dimensions of the order of ten nanometres to a few tens of nanometres, in particular when x is higher than 8%, and especially when x is higher than or equal to 10%.

The known etching methods based on $Cl_2$ do not allow straight and smooth etch flanks to be formed. Indeed, the known etching methods tend to produce etch flanks of high roughness and/or to produce different etches (i.e. to different depths) between layer 1 of Ge and layer 2 of GeSn, as illustrated in FIG. 1A where it can be seen that the etch is deeper for the GeSn than for the Ge. However, it is essential to have etched flanks of low roughness in order to optimize the conductivity of the GeSn channel, by maximizing the velocity of the charge carriers.

Additionally, the known etching methods tend to leave an etch bottom 4 that is not smooth, i.e. an etch bottom exhibiting spikes, as illustrated in FIG. 1B. However, it is essential to have an etch bottom that is as smooth as possible, i.e. that exhibits the fewest spikes possible, so as to reproducibly and reliably concatenate the technological steps required to produce the transistors.

These phenomena of flanks of high roughness and/or etch bottoms with spikes tend to be amplified when the percentage x of tin in the $Ge_{1-x}Sn_x$ alloy increases.

In this context, it is in particular essential to have an improved method for etching $Ge_{1-x}Sn_x$ alloys with x strictly higher than 0% and strictly lower than 30% which makes it possible to obtain etch flanks with low roughness and etches to equal depths between the Ge and the $Ge_{1-x}Sn_x$, and a smooth etch bottom, as illustrated in FIG. 1C. In particular, x is between 6% and 15%, and preferably x is higher than 8%.

SUMMARY OF THE INVENTION

The invention aims to provide a method for etching $Ge_{1-x}Sn_x$ that makes it possible to obtain etch flanks of low roughness and an etch bottom that is as smooth as possible, and to achieve this even for percentages x of tin higher than 8%.

A first subject allowing these drawbacks to be overcome is a method for the nanoscale etching of a layer of $Ge_{1-x}Sn_x$ on a carrier for a FET transistor, x being the concentration of tin, the etching method being characterized in that it comprises:

a step of plasma-etching said layer of $Ge_{1-x}Sn_x$ using a mixture comprising dichlorine ($Cl_2$) and dinitrogen ($N_2$) and under an etching pressure lower than or equal to 50 mTorr, preferably lower than or equal to 10 mTorr.

It is specified that 1 Torr is equivalent to 133.322 Pa and therefore 1 mTorr is equivalent to 0.133322 Pa.

The carrier may be: an insulator, a silicon or silicon-on-insulator (SOI) substrate, a germanium substrate, a silicon substrate covered with a layer of germanium, a germanium-on-insulator substrate or any other substrate based on III-V semiconductors (for example: GaAs, InP). The carrier preferably comprises Ge as the last layer (such that the layer of GeSn alloy is on Ge).

The concentration x of tin in the $Ge_{1-x}Sn_x$ alloy is substantially lower than 30%. What is meant by substantially is 30%±10%. This concentration x of tin in the GeSn alloy allows a crystalline GeSn layer to be obtained. Furthermore, the concentration x of tin in the $Ge_{1-x}Sn_x$ alloy is preferably strictly higher than 0%.

According to one particular embodiment, the concentration x of tin in the $Ge_{1-x}Sn_x$ alloy is substantially lower than 30%±3%.

The temperature of the etching step is lower than 50° C. and preferably at ambient temperature.

The etching method according to the invention, by combining a suitable plasma chemistry (mixture of dichlorine $Cl_2$ and dinitrogen $N_2$, potentially with dioxygen $O_2$) with very low pressure (lower than 50 mTorr, preferably lower than or equal to 10 mTorr) makes it possible to obtain fins or nanowires based on $Ge_{1-x}Sn_x$ with dimensions of the order of a few nanometres to a few tens of nanometres, and to achieve this with etch flanks of low roughness, and a smooth etch bottom, i.e. without spikes, even when x is higher than 8%. A "chemistry" refers to a mixture of gases for carrying out an etch.

The $Cl_2$ and $N_2$ mixture allows the $Ge_{1-x}Sn_x$ material to be etched while the $O_2$ ensures a high degree of etching verticality by passivating the flanks.

According to one embodiment, the concentration x of tin in the $Ge_{1-x}Sn_x$ is higher than 5%, preferably higher than or equal to 10%.

According to one embodiment, the etching pressure is lower than or equal to 10 mTorr for a concentration x of tin lower than 8%, and it is lower than or equal to 5 mTorr for a concentration x of tin higher than or equal to 8%.

According to one embodiment, the etching pressure is lower than or equal to 2 mTorr for a concentration x of tin higher than or equal to 15%.

According to one embodiment, the mixture further comprises dioxygen ($O_2$).

Preferably, if the concentration x of tin in the GeSn alloy is lower than 10%, the mixture consists of a mixture of $Cl_2$, $N_2$ and $O_2$.

According to one advantageous embodiment, the etching method further comprises a step of removing the chemical or native oxide from the tin, said removal step coming before the step of plasma-etching the $Ge_{1-x}Sn_x$. Performing such a removal step makes it possible to have a less gradated etch profile, especially when the concentration x of tin is higher than or equal to 15%.

According to one particular embodiment, the removal step consists of an acid chemical attack, the acid preferably being hydrofluoric acid (HF) or hydrochloric acid (HCl). The concentration by weight of acid may be between 1 and 37%, preferably between 10 and 30%.

According to one embodiment, the etching method further comprises a step of depositing a mask on the layer of $Ge_{1-x}Sn_x$, preferably a hard mask, for example a mask made of hydrogen silsesquioxane (HSQ) resin, said deposition step coming before the step of plasma-etching the $Ge_{1-x}Sn_x$.

According to one embodiment, the etching method further comprises a step of removing the mask, said removal step coming after the step of plasma-etching the $Ge_{1-x}Sn_x$.

A second subject of the invention is a method for producing at least one conduction channel on a carrier for a FET transistor, the production method comprising the following steps:

a step of forming a layer of $Ge_{1-x}Sn_x$ on said carrier, said layer being produced by epitaxial growth;

a step of etching the layer of $Ge_{1-x}Sn_x$ produced according to the etching method.

According to one embodiment, the free surface of the carrier comprises a layer of Ge such that the layer of $Ge_{1-x}Sn_x$ is formed on the layer of Ge, and the production method further comprises a step of selectively plasma-etching the layer of Ge, said selective plasma-etching step preferably being performed using carbon tetrafluoride ($CF_4$) and coming after the step of etching the $Ge_{1-x}Sn_x$.

Preferably, the carrier is a silicon or silicon-on-insulator substrate on which a layer of Ge has been deposited.

The selective plasma-etching step is preferably carried out at ambient temperature and at a pressure of the order of 100 mTorr, or of the order of 50 mTorr.

A third subject of the invention is a conduction channel made of $Ge_{1-x}Sn_x$ for a FET transistor, the channel being obtained by means of the production method according to the second subject of the invention. According to the invention, the etch bottom of the carrier around the etched layer of $Ge_{1-x}Sn_x$ is smooth, i.e. it exhibits a surface roughness lower than 2 nanometres, preferably lower than 0.5 nanometre. The surface roughness is determined by RMS ("root mean square").

According to one embodiment, the conduction channel made of $Ge_{1-x}Sn_x$ forms horizontal fins arranged one above the other.

According to another embodiment, the conduction channel made of $Ge_1Sn_x$ forms nanowires. The nanowires may be vertical or horizontal.

A fourth subject of the invention is a FET transistor comprising a plurality of conduction channels made of $Ge_{1-x}Sn_x$ according to the third subject of the invention.

BRIEF DESCRIPTION OF THE DRAWINGS

Other features and advantages of the invention will become apparent through the description which follows by way of non-limiting illustration, given with reference to the appended figures, in which.

DETAILED DESCRIPTION

Producing Vertical Nanowires

The production method generally depends on the percentage x of Sn in the $Ge_{1-x}Sn_x$ alloy.

For the four embodiments presented below, prior to etching, a layer of $Ge_{1-x}Sn_x$ is formed on a layer of germanium (Ge). The layer of $Ge_{1-x}Sn_x$ s formed by epitaxial growth, in particular by chemical vapour deposition or molecular-beam epitaxy. Next, a step of depositing a mask is carried out on the $Ge_{1-x}Sn_x$, preferably a hard mask. For example, it may involve depositing hydrogen silsesquioxane (HSQ) resin, deposited using a "spin-coating" method. Once the etching process has ended, the resin is removed, for example by immersing in hydrofluoric acid (HF) diluted to a few percent or in a "buffered-oxide-etch" or "BOE" solution (for example a solution with a ratio by volume of ammonium fluoride to hydrofluoric acid of 6:1).

The flow rate of the gases is given in sccm, i.e. in $cm^3/min$, under standard temperature and pressure conditions.

In all of the embodiments presented below, the temperature is generally ambient temperature.

According to a first embodiment, applicable in particular when the percentage x of Sn in the $Ge_{1-x}Sn_x$ alloy is higher than 2% and lower than 8%, for example equal to 6%, a plasma etch is carried out with a chemistry comprising a mixture of dichloride ($Cl_2$), of dinitrogen ($N_2$) and of dioxygen ($O_2$) at a pressure lower than or equal to 10 mTorr.

The etch is carried out for example in an ICP-RIE ("inductively coupled plasma-reactive-ion etching") chamber. In this case, the pressure given corresponds to the pressure in the chamber.

The flow rates of $Cl_2$, $N_2$ and $O_2$ are between 15 and 20 sccm, 4 and 8 sccm and 10 and 15 sccm, respectively.

The bias power and plasma-generation power with ICP are between 30 and 60 watts and 30 and 60 watts, respectively.

An etch rate of between 2 and 4 nanometres/second is obtained.

Figure 1A:
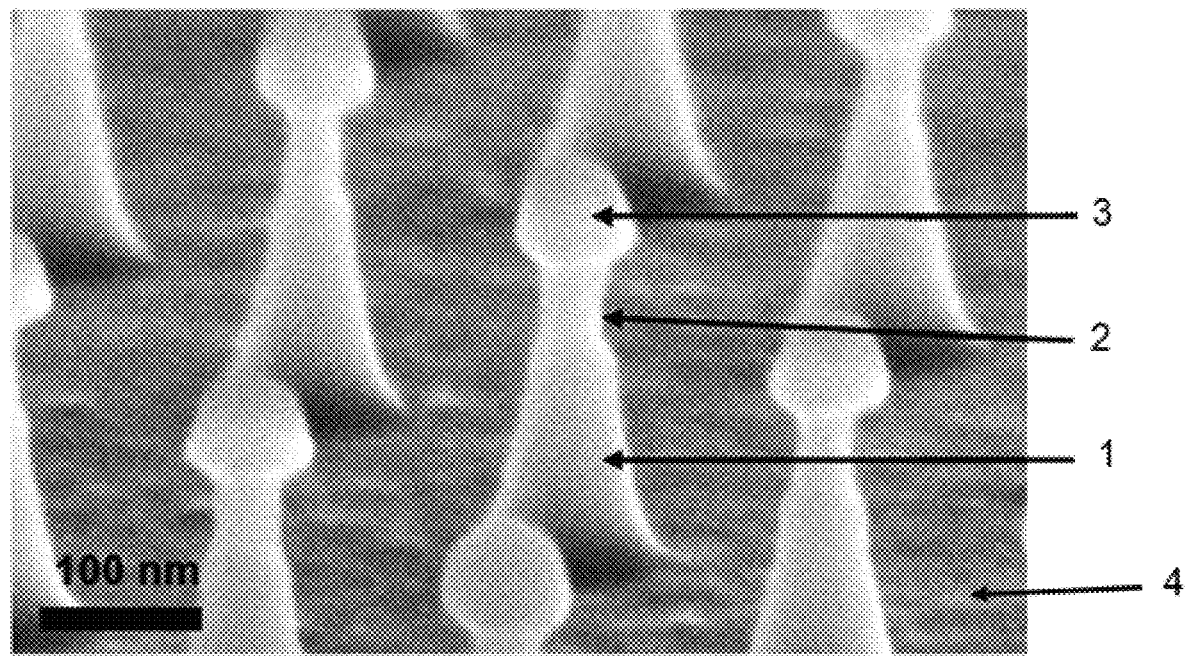
FIG. 1A shows vertical nanowires made of $Ge_{1-x}Sn_x$ with x equal to 6% exhibiting etch flanks of high roughness.
Figure 1B:
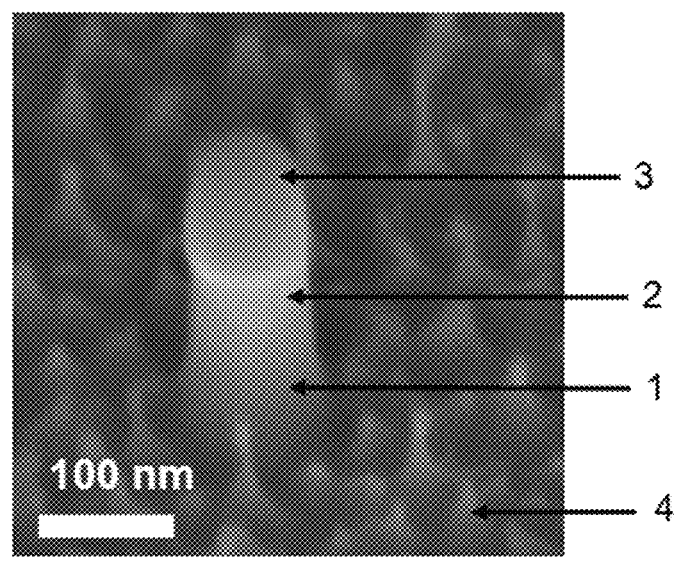
FIG. 1B shows vertical nanowires made of $Ge_{1-x}Sn_x$ with x equal to 6% exhibiting a non-smooth etch bottom comprising spikes.
Figure 1C:
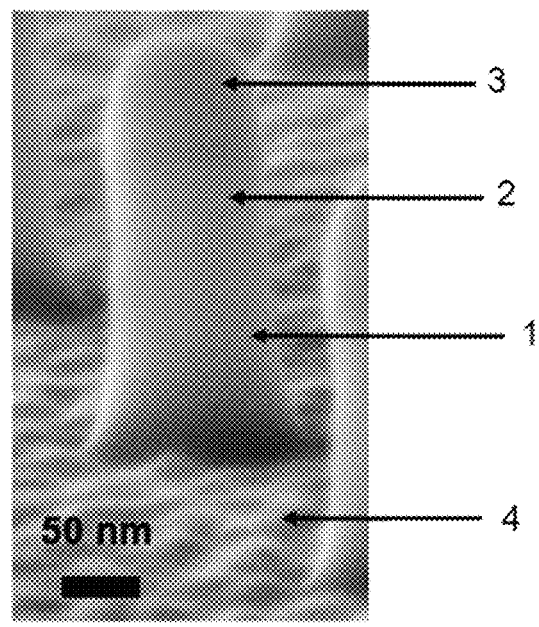
FIG. 1C shows vertical nanowires made of $Ge_{1-x}Sn_x$ with x equal to 6% exhibiting etch flanks of low roughness and an etch bottom without spikes, which are obtained according to a first embodiment of the invention.

This makes it possible to obtain vertical nanowires 2 made of $Ge_{1-x}Sn_x$ such as shown in FIG. 1C, with straight, very vertical flanks, without a difference in etching between layer 1 of Ge and layer 2 of $Ge_{1-x}Sn_x$, and which closely follow the etch profile dictated by the mask 3 made of HSQ resin. Furthermore, the etch bottom 4 is free of spikes.

According to a second embodiment, applicable in particular when the percentage x of Sn in the $Ge_{1-x}Sn_x$ alloy is higher than or equal to 8% and lower than 15%, for example equal to 10%, a plasma etch is carried out with a chemistry comprising a mixture of dichloride ($Cl_2$), of dinitrogen ($N_2$) and of dioxygen ($O_2$) at a pressure lower than or equal to 5 mTorr.

The etch is carried out for example in an ICP-RIE ("inductively coupled plasma-reactive-ion etching") chamber. In this case, the pressure given corresponds to the pressure in the chamber.

The flow rates of $Cl_2$, $N_2$ and $O_2$ are between 15 and 20 sccm, 4 and 8 sccm and 10 and 15 sccm, respectively.

The bias power and plasma-generation power with ICP are between 30 and 60 watts and 30 and 60 watts, respectively.

An etch rate of between 2 and 4 nanometres/second is obtained.

Figure 2A:
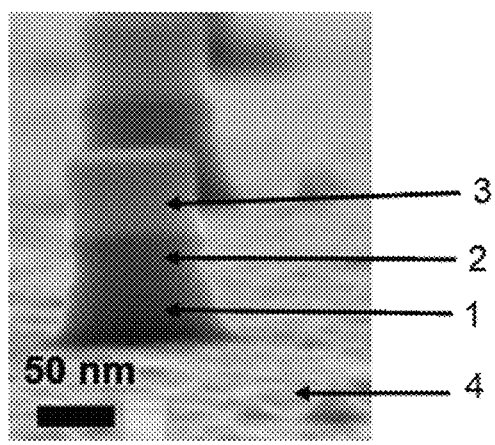
FIG. 2A shows vertical nanowires made of $Ge_{1-x}Sn_x$ with x equal to 10% exhibiting etch flanks of high roughness and an etch bottom without spikes.
Figure 2B:
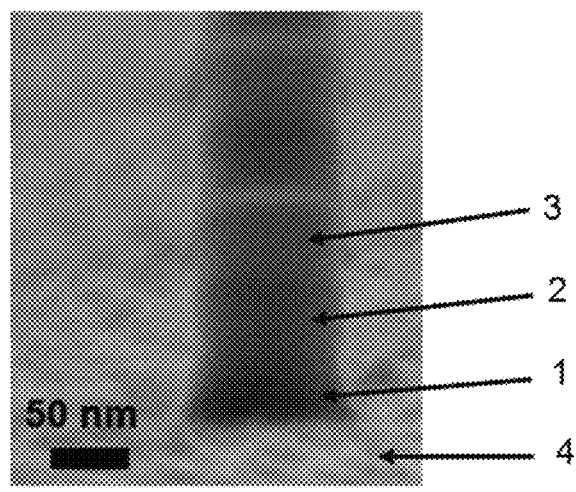
FIG. 2B shows vertical nanowires made of $Ge_{1-x}Sn_x$ with x equal to 10% exhibiting etch flanks of low roughness and an etch bottom without spikes, which are obtained according to a second embodiment of the invention.

This makes it possible to obtain vertical nanowires 2 made of $Ge_{1-x}Sn_x$ such as shown in FIG. 2B, with straight, vertical flanks, without a difference in etching between layer 1 of Ge and layer 2 $Ge_{1-x}Sn_x$, and which follow the etch profile dictated by the mask 3 made of HSQ resin. Furthermore, the etch bottom 4 is free of spikes. Decreasing the pressure to 5 mTorr makes it possible to have a less gradated profile, in comparison with the profile shown in FIG. 2A.

According to a third embodiment, applicable in particular when the percentage x of Sn in the $Ge_{1-x}Sn_x$ alloy is higher than or equal to 15%, it is possible to carry out a plasma etch with a chemistry comprising a mixture of dichloride ($Cl_2$) and of dinitrogen ($N_2$), i.e. without dioxygen ($O_2$), at a pressure of between 2 mTorr and 5 mTorr, advantageously equal to 2 mTorr.

The etch is carried out for example in an ICP-RIE ("inductively coupled plasma-reactive-ion etching") chamber. In this case, the pressure given corresponds to the pressure in the chamber.

The flow rates of $Cl_2$ and $N_2$ are between 15 and 20 sccm and between 4 and 8 sccm, respectively.

The bias power and plasma-generation power with ICP are between 30 and 60 watts and 30 and 60 watts, respectively.

An etch rate of between 2 and 4 nanometres/second is obtained.

Figure 3A:
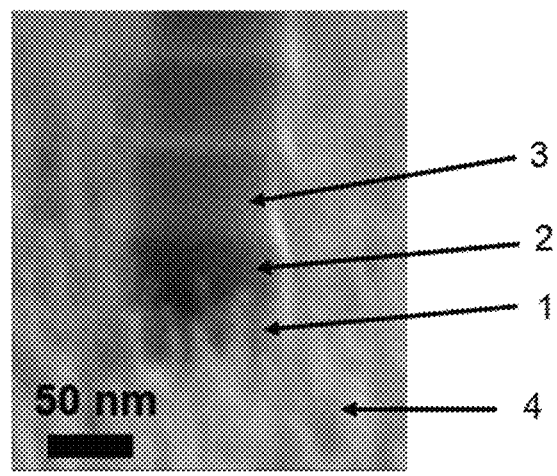
FIG. 3A shows vertical nanowires made of $Ge_{1-x}Sn_x$ with x equal to 15% exhibiting etch flanks of high roughness and an etch bottom with spikes.
Figure 3B:
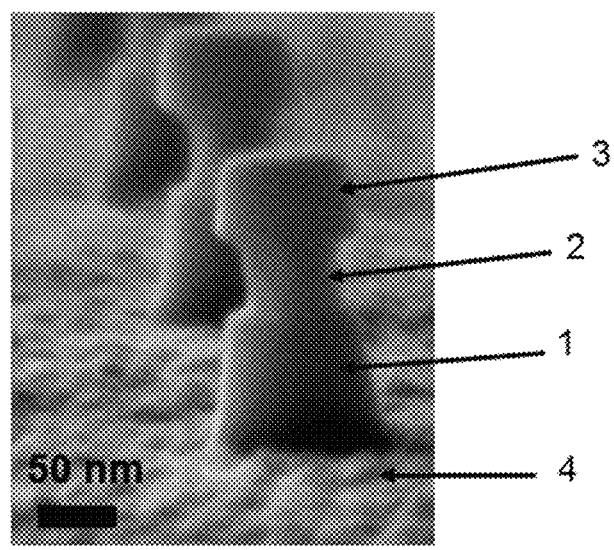
FIG. 3B shows vertical nanowires made of $Ge_{1-x}Sn_x$ with x equal to 15% exhibiting etch flanks of low roughness and an etch bottom without spikes, which are obtained according to a third embodiment of the invention.

This makes it possible to obtain vertical nanowires 2 made of $Ge_{1-x}Sn_x$ such as shown in FIG. 3B, with straight, very vertical flanks. Furthermore, the etch bottom 4 is free of spikes. Removing the dioxygen from the plasma chemistry makes it possible to have a less gradated profile, in comparison with the profile shown in FIG. 3A.

According to a fourth embodiment, applicable in particular when the percentage x of Sn in the $Ge_{1-x}Sn_x$ alloy is higher than or equal to 15%, it is possible to carry out a plasma etch with a chemistry comprising a mixture of dichloride ($Cl_2$), of dinitrogen ($N_2$) and of dioxygen ($O_2$), at a pressure of between 2 mTorr and 5 mTorr, advantageously equal to 2 mTorr. Additionally, prior to plasma etching, the $Ge_{1-x}Sn_x$ alloy is treated with acid in order to preferentially remove the chemical or native oxide from the tin.

The flow rates of $Cl_2$, $N_2$ and $O_2$ are between 15 and 20 sccm, 4 and 8 sccm and 10 and 15 sccm, respectively.

The bias power and ICP power are between 30 and 60 watts and 30 and 60 watts, respectively.

An etch rate of between 2 and 4 nanometres/second is obtained.

Figure 3C:
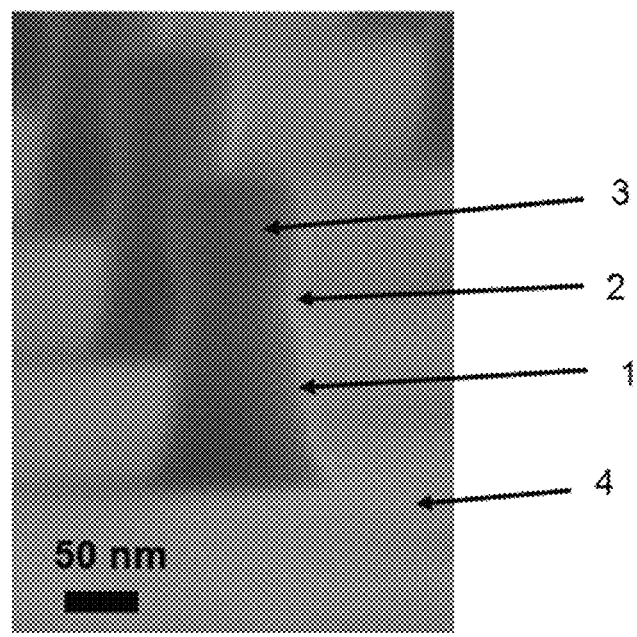
FIG. 3C shows vertical nanowires made of $Ge_{1-x}Sn_x$ with x equal to 15% exhibiting etch flanks of low roughness and an etch bottom without spikes, which are obtained according to a fourth embodiment of the invention.

This makes it possible to obtain vertical nanowires 2 made of $Ge_{1-x}Sn_x$ such as shown in FIG. 3C, with straight, vertical flanks, without a difference in etching between layer 1 of Ge and layer 2 of $Ge_{1-x}Sn_x$, and which follow the etch profile dictated by the mask 3 made of HSQ resin. Furthermore, the etch bottom 4 is free of spikes. Carrying out a pretreatment with acid makes it possible to have an even less gradated profile, in comparison with the profile shown in FIG. 3A.

Exemplary Implementation According to the Fourth Embodiment, with x Equal to 15%.

The $Ge_{1-x}Sn_x$ alloy is exposed to hydrochloric acid (HCl), for example by immersing it in a bath of HCl at ambient temperature and at atmospheric pressure for a few minutes (for example 3 minutes), with light stirring.

Next, during the plasma etch, the temperature is 20° C. The bias power is 50 W. The ICP power is 50 W. The etch pressure is 2 mTorr. The flow rate of $Cl_2$ is 18 sccm. The flow rate of $O_2$ is 5 sccm. The flow rate of $N_2$ is 13 sccm.

The etch rate obtained is of the order of 2.5 nanometres/second.

Producing Horizontal Nanowires or Horizontal Fins

An exemplary method for horizontal nanowires or horizontal fins is presented in FIGS. 4A to 4E.

Prior to etching, a layer of $Ge_{1-x}Sn_x$ is formed on Ge. The layer of $Ge_{1-x}Sn_x$ is formed by epitaxial growth, in particular by chemical vapour deposition or molecular-beam epitaxy.

Next, a step of depositing a mask is carried out on the $Ge_{1-x}Sn_x$, preferably a hard mask. For example, it may involve depositing hydrogen silsesquioxane (HSQ) resin using electron-beam lithography.

Figure 4A:
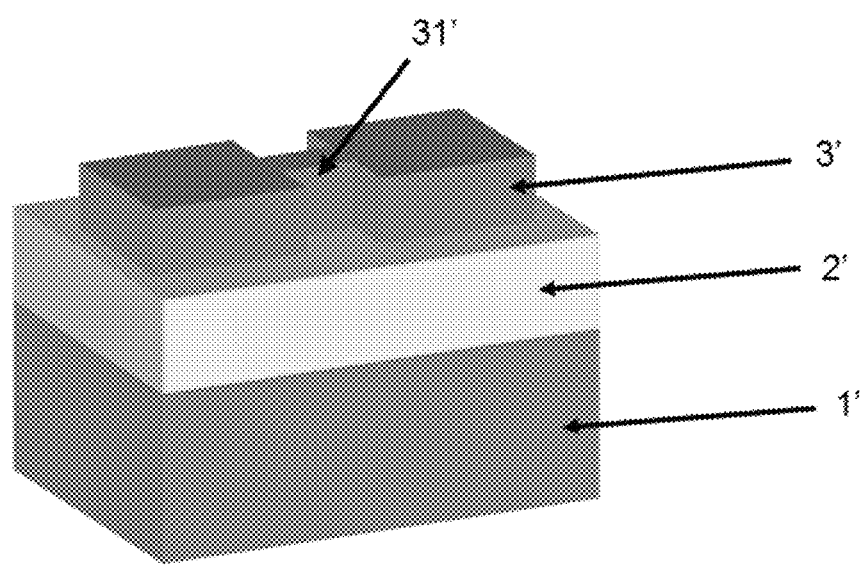
FIGS. 4A-4E show a method for producing horizontal nanowires or horizontal fins.

Typically, what is obtained is a structure of the type presented in FIG. 4A with a layer 1' of Ge with a thickness of the order of 1.2 μm, on which is arranged a layer 2' of $Ge_{1-x}Sn_x$ with a thickness of the order of 50 nm and a mask 3' made of HSQ which comprises in particular the desired shape of the fin 31'.

A first plasma etch is carried out according to the etching method of the invention, in particular according to one of the four embodiments described above. The etch conditions described above (embodiments, exemplary implementation) may also be applied. In particular, the bias power and plasma-generation power with ICP may be equal to 50 watts.

Figure 4B:
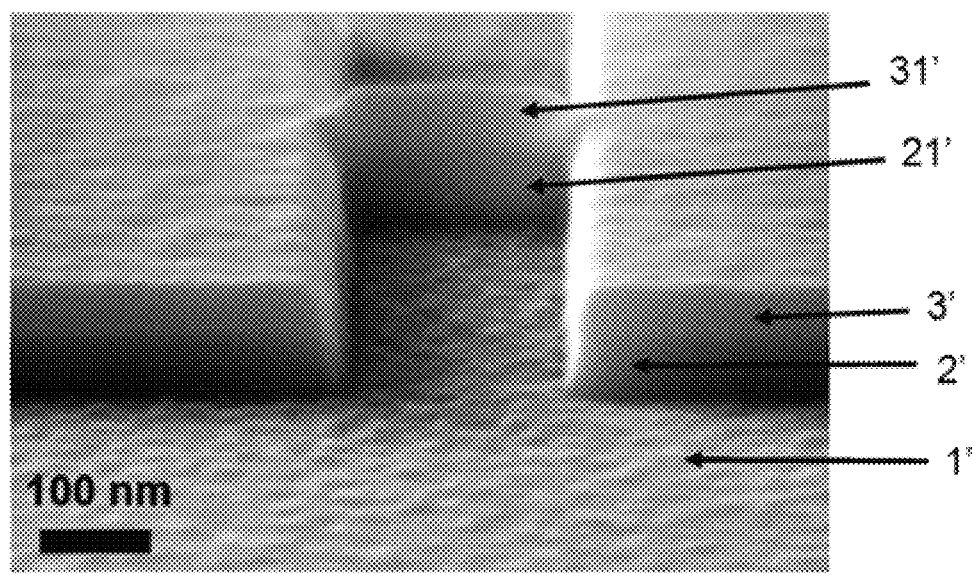

Thus, what is obtained is a structure of the type presented in FIG. 4B in which layer 2' of $Ge_{1-x}Sn_x$ has been etched to form a fin 21' made of $Ge_{1-x}Sn_x$. On the layer of $Ge_{1-x}Sn_x$ thus etched, the mask 3' made of HSQ with the shape of the fin 31' is still present, and all of the layer of $Ge_{1-x}Sn_x$ is still in contact with layer 1' of Ge.

A second plasma etch is then carried out using $CF_4$. This second etch may be referred to as a "selective etch" in that it aims etch the germanium (Ge) and not the GeSn.

According to one exemplary implementation, a flow rate of $CF_4$ equal to 100 sccm, at a pressure of 50 mTorr, at ambient temperature, an ICP power of 500 watts and a bias power of 5 watts may be chosen in order to preferentially etch the germanium (Ge) while leaving the GeSn intact.

Figure 4C:
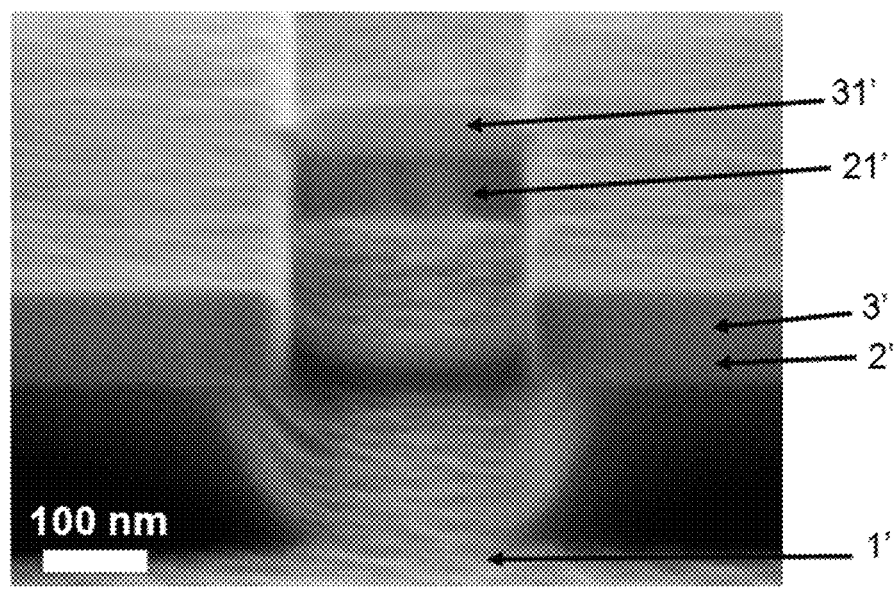

What is obtained is a structure of the type presented in FIG. 4C in which layer 1' of Ge has been etched beneath the fin 21' made of $Ge_{1-x}Sn_x$. A portion of layer 2' of $Ge_{1-x}Sn_x$ is thus no longer in contact with layer 1' of Ge, more precisely at the location of the fin 21' made of $Ge_{1-x}Sn_x$. The mask 3' made of HSQ with the shape of the fin 31' of the mask is still present.

Lastly, the resin made of HSQ is removed, for example using a bath of hydrofluoric acid (HF) or in a "buffered-oxide-etch" solution as described above.

Figure 4D:
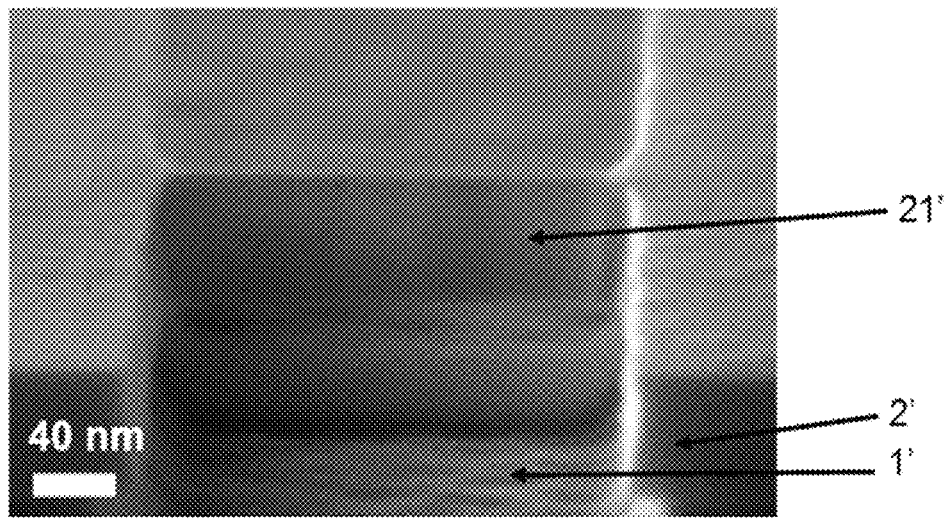
Figure 4E:
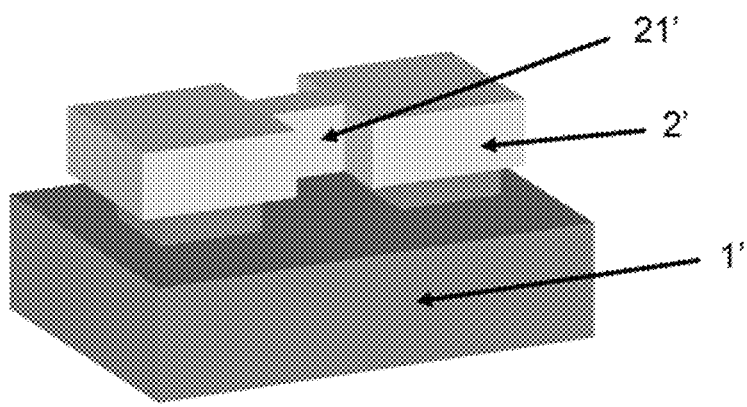

What is obtained is a structure of the type presented in FIG. 4D in which the mask made of HSQ has been removed.

The present invention is not limited to the embodiments described above but rather extends to any embodiment that comes within the scope of the claims.

The invention makes it possible to produce vertical or horizontal nanowires or fins based on GeSn with dimensions of the order of ten nanometres to a few tens of nanometres.

The invention applies in particular to the production of conduction channels for FinFET (fin field-effect transistor) transistors, GAAFET (gate-all-around field-effect transistor) transistors, or tunnel FET (TFET) transistors.

In general, the invention applies to the production of FET transistors that are advantageously intended for high-performance and low-consumption logic applications in microelectronics, and/or may be used for "IoT" (Internet of things) applications.

The invention claimed is:

1. A method for performing nanoscale etching of a layer of $Ge_{1-x}Sn_x$ on a carrier for a FET transistor, x being a concentration of tin and being higher than 10% and lower than 30%, the method comprising:
   a step of removing a chemical or native oxide from the tin; and
   a step of plasma-etching said layer of $Ge_{1-x}Sn_x$ using a mixture comprising dichlorine ($Cl_2$) and dinitrogen ($N_2$) and under an etching pressure lower than or equal to 50 mTorr, preferably lower than or equal to 10 mTorr;
   said step of removing being anterior to said step of plasma-etching.

2. The method according to claim 1, the etching pressure being lower than or equal to 5 mTorr.

3. The method according to claim 2, the etching pressure being lower than or equal to 2 mTorr for a concentration x of tin higher than or equal to 15%.

4. The method according to claim 1, the mixture further comprising dioxygen ($O_2$).

5. The method according to claim 1, the step of removing consisting of an acid chemical attack, the acid preferably being hydrofluoric acid (HF) or hydrochloric acid (HCl).

6. The method according to claim 1, further comprising a step of depositing a mask on the layer of $Ge_{1-x}Sn_x$, preferably a hard mask, for example a mask made of hydrogen silsesqwoxane (HSQ) resin, said deposition step coming before the step of plasma-etching the $Ge_{1-x}Sn_x$.

7. The method according to claim 6, further comprising a step of removing the mask, said step of removing the mask coming after the step of plasma-etching the $Ge_{1-x}Sn_x$.

8. A method for producing at least one conduction channel on a carrier for a FET transistor, said method comprising the following steps:
   a step of forming a layer of $Ge_{1-x}Sn_x$ on said carrier, said layer being produced by epitaxial growth; and
   a step of etching the layer of $Ge_{1-x}Sn_x$ produced according to the method described in claim 1.

9. The method according to claim 8, the carrier comprising a free surface, the free surface comprising a layer of Ge such that the layer of $Ge_{1-x}Sn_x$ is formed on the layer of Ge, the method further comprising a step of selectively plasma-etching the layer of Ge, said selective plasma-etching step preferably being performed using carbon tetrafluoride ($CF_4$) and coming after the step of etching the $Ge_{1-x}Sn_x$.

10. A conduction channel made of $Ge_{1-x}Sn_x$ for a FET transistor, the conduction channel being obtained according to the method of claim 8, the carrier comprising an etch bottom, the etch bottom around the etched layer of $Ge_{1-x}Sn_x$ being smooth, i.e. exhibiting a surface roughness lower than 2 nanometres, preferably lower than 0.5 nanometre.

11. The conduction channel made of $Ge_{1-x}Sn_x$ according to claim 10 forming horizontal fins arranged one above the other.

12. The conduction channel made of $Ge_{1-x}Sn_x$ according to claim 10 forming nanowires.

13. A FET transistor comprising a plurality of conduction channels made of $Ge_{1-x}Sn_x$ that are chosen according to claim 10.

* * * * *